United States Patent
Bonora et al.

[11] Patent Number: 5,931,631
[45] Date of Patent: Aug. 3, 1999

[54] METHOD AND APPARATUS FOR VERTICAL TRANSFER OF A SEMICONDUCTOR WAFER CASSETTE

[75] Inventors: Anthony C. Bonora, Menlo Park; Michael A. Neads, Fremont; Joshua T. Oen, Newark, all of Calif.

[73] Assignee: Asyst Technologies, Inc., Fremont, Calif.

[21] Appl. No.: 09/083,834

[22] Filed: May 22, 1998

Related U.S. Application Data

[62] Division of application No. 08/500,219, Jul. 10, 1995, Pat. No. 5,788,458.

[51] Int. Cl.⁶ ................................................. B65G 49/07
[52] U.S. Cl. ........................................... 414/416; 414/937
[58] Field of Search ...................... 414/217, 403, 414/411, 416, 618, 744.3, 749, 937, 940

[56] References Cited

U.S. PATENT DOCUMENTS

| | | | |
|---|---|---|---|
| 5,431,600 | 7/1995 | Murata et al. | 414/940 X |
| 5,462,397 | 10/1995 | Iwabuchi | 414/937 X |
| 5,538,385 | 7/1996 | Bacchi et al. | 414/403 |
| 5,562,383 | 10/1996 | Iwai et al. | 414/411 X |
| 5,570,990 | 11/1996 | Bonora et al. | 414/618 X |
| 5,628,604 | 5/1997 | Murata et al. | 414/411 X |
| 5,655,869 | 8/1997 | Scheler et al. | 414/940 X |
| 5,664,927 | 9/1997 | Takeuchi | 414/940 X |
| 5,810,537 | 9/1998 | Briner et al. | 414/217 |

FOREIGN PATENT DOCUMENTS

| | | | |
|---|---|---|---|
| 552756 | 7/1993 | European Pat. Off. | 414/940 |
| 4326309 | 9/1994 | Germany | 414/940 |
| 5109867 | 4/1993 | Japan | 414/937 |

*Primary Examiner*—James W. Keenan
*Attorney, Agent, or Firm*—Fliesler, Dubb, Meyer & Lovejoy

[57] ABSTRACT

A method and apparatus for removing a semiconductor wafer cassette from a SMIF pod and for transferring the cassette along a vertical axis to a platform of a wafer processing station. The apparatus is comprised of a transfer device that includes a pair of gripping arms for gripping the wafer cassette from the sides of the cassette. Once gripped, the cassette moves with the transfer device upward along a vertical axis to make room for the platform to be extended from within the processing station to a position under the cassette. Thereafter, the direction of motion of the transfer device is reversed and the cassette is lowered onto the platform. Once seated on the platform, the gripping arms retract from the cassette, and the cassette is carried on the platform into the processing station.

9 Claims, 13 Drawing Sheets

METHOD AND APPARATUS FOR VERTICAL TRANSFER OF A SEMICONDUCTOR WAFER CASSETTE

This application is a divisional of Ser. No. 08/500,219, filed Jul. 10, 1995, now U.S. Pat. No. 5,788,458.

CROSS REFERENCE TO RELATED APPLICATION

This application is related to the following copending U.S. patent applications:

Patent application Ser. No. 08/311,954 entitled, "SEMICONDUCTOR WAFER CASSETTE," by Bonora et al., filed Sep. 26, 1994, now abandoned;

patent application Ser. No. 08/394,698 entitled, "STANDARD MECHANICAL INTERFACE VACUUM LOADLOCK CHAMBER," by Bonora et al., filed Feb. 27, 1995, now U.S. Pat. No. 5,586,585.

The above patent applications are owned by the assignee of the present invention and are incorporated by reference herein in their entirety.

BACKGROUND OF THE INVENTION

1. Field of the Invention

The present invention relates to a transfer device for use with standardized mechanical interface (SMIF) systems for facilitating semiconductor wafer fabrication, and in particular to a transfer mechanism for gripping and transport of a semiconductor wafer cassette along a vertical axis.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 $\mu$m to above 200 $\mu$m. Particles with these sizes can be very damaging in semiconductor processing because of the small geometries employed in fabricating semiconductor devices. Typical advanced semiconductor processes today employ geometries which are one-half micron ($\mu$m) and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system has three main components: (1) sealed pods, having a minimal volume, used for storing and transporting cassettes which hold the semiconductor wafers; (2) enclosures placed over cassette ports and wafer processing areas of processing equipment so that the environments inside the pods and enclosures (after having clean air sources) become miniature clean spaces; and (3) a transfer mechanism to load/unload wafer and/or wafer cassettes from a sealed pod without contamination of the wafers in the wafer cassette from external environments.

It is important that a precisely controllable system be provided for transferring wafer cassettes from, for example, a SMIF pod to within a semiconductor wafer processing station in order to avoid damaging the wafers within the cassette. Any such damage may be significant as a single cassette may presently carry as much as $20,000 to $30,000 worth of 200 mm wafers.

Figure 1A:
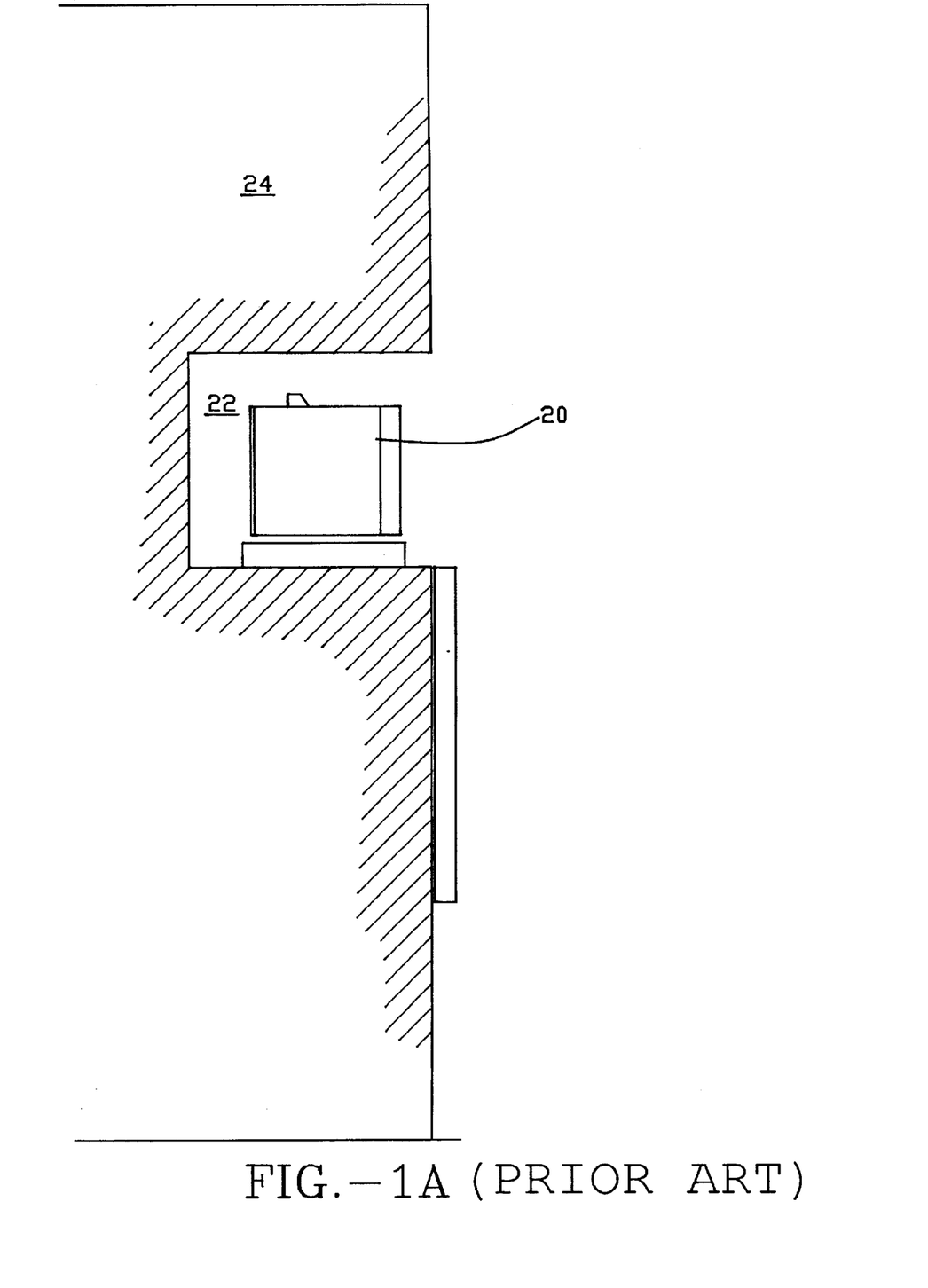
FIG. 1A is a side view of a cassette loaded into a cassette chamber of a processing station.
Figure 1B:
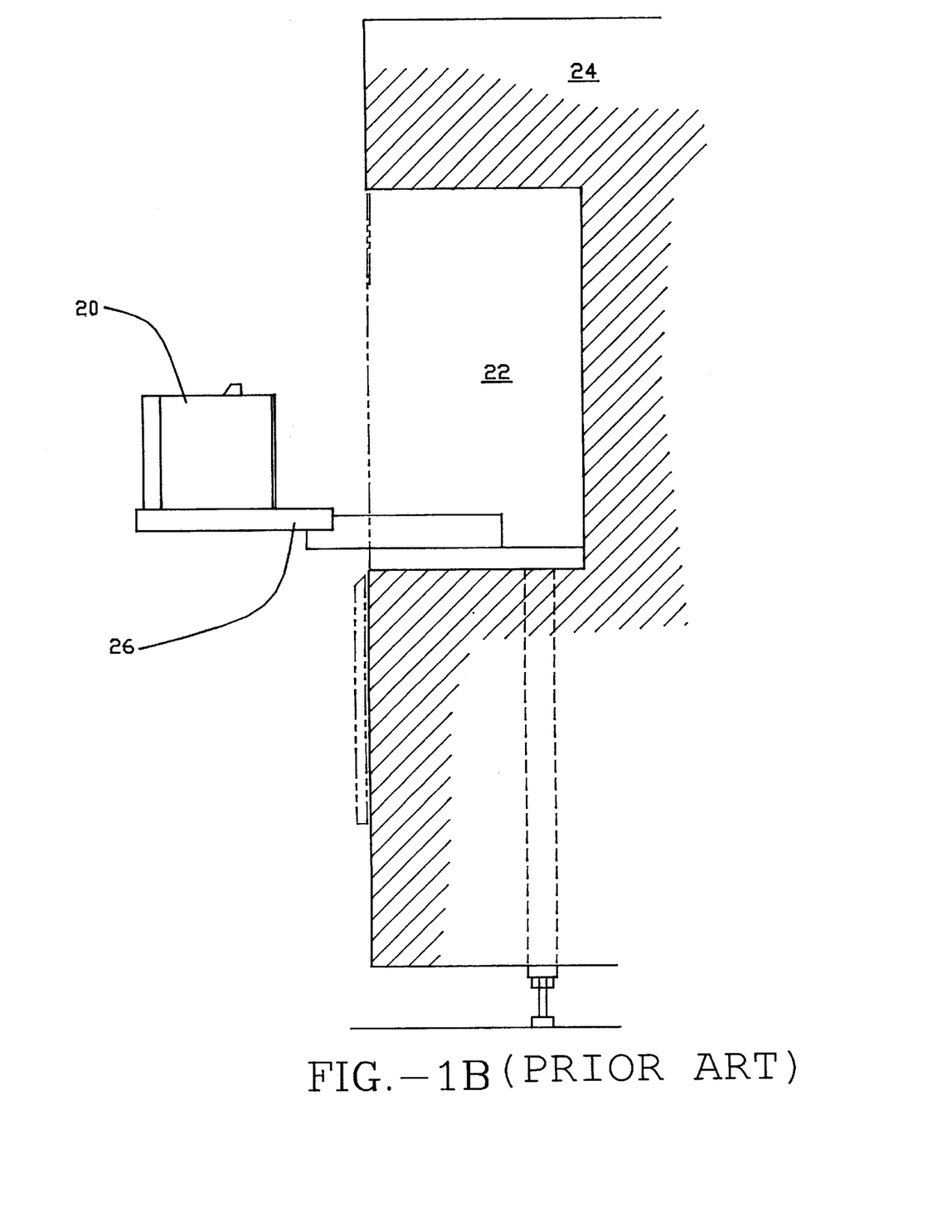
FIG. 1B is a side view of a cassette loaded onto a platform of a processing station.

There are presently several known schemes for transferring a semiconductor wafer cassette into a wafer processing station. Two common schemes are shown in FIGS. 1A and 1B, respectively. In the system of FIG. 1A, after a semiconductor wafer cassette 20 has been separated from a SMIF pod (not shown), the cassette may be loaded into a cassette chamber 22 of a wafer processing station 24 by first vertically raising or lowering the cassette along a Y-axis to the properly align the cassette with the cassette chamber, and second by horizontally moving the cassette along an X-axis into the cassette chamber.

The system of FIG. 1B differs from the system of FIG. 1A in that the processing station 24 includes a platform 26 that extends out of the cassette chamber 22 when a cassette is to be loaded into the chamber. In some processing stations, the wafer cassette is desirably loaded deep within the cassette chamber. In such instances, the wafer cassette transfer device may load the cassette on to the extended platform, which platform may then be retracted into the cassette chamber with the cassette supported thereon. In the system of FIG. 1B, after the cassette is positioned adjacent to the processing station 24, the cassette 20 need only be moved vertically along the Y-axis until the cassette is located above the platform, and then lowered along the Y-axis onto the platform after the platform has been extended. Thus, the system of FIG. 1A requires a transfer mechanism capable of moving in both the X and Y directions, whereas the system of FIG. 1B requires a transfer mechanism capable of moving solely in the Y direction.

Figure 1C:
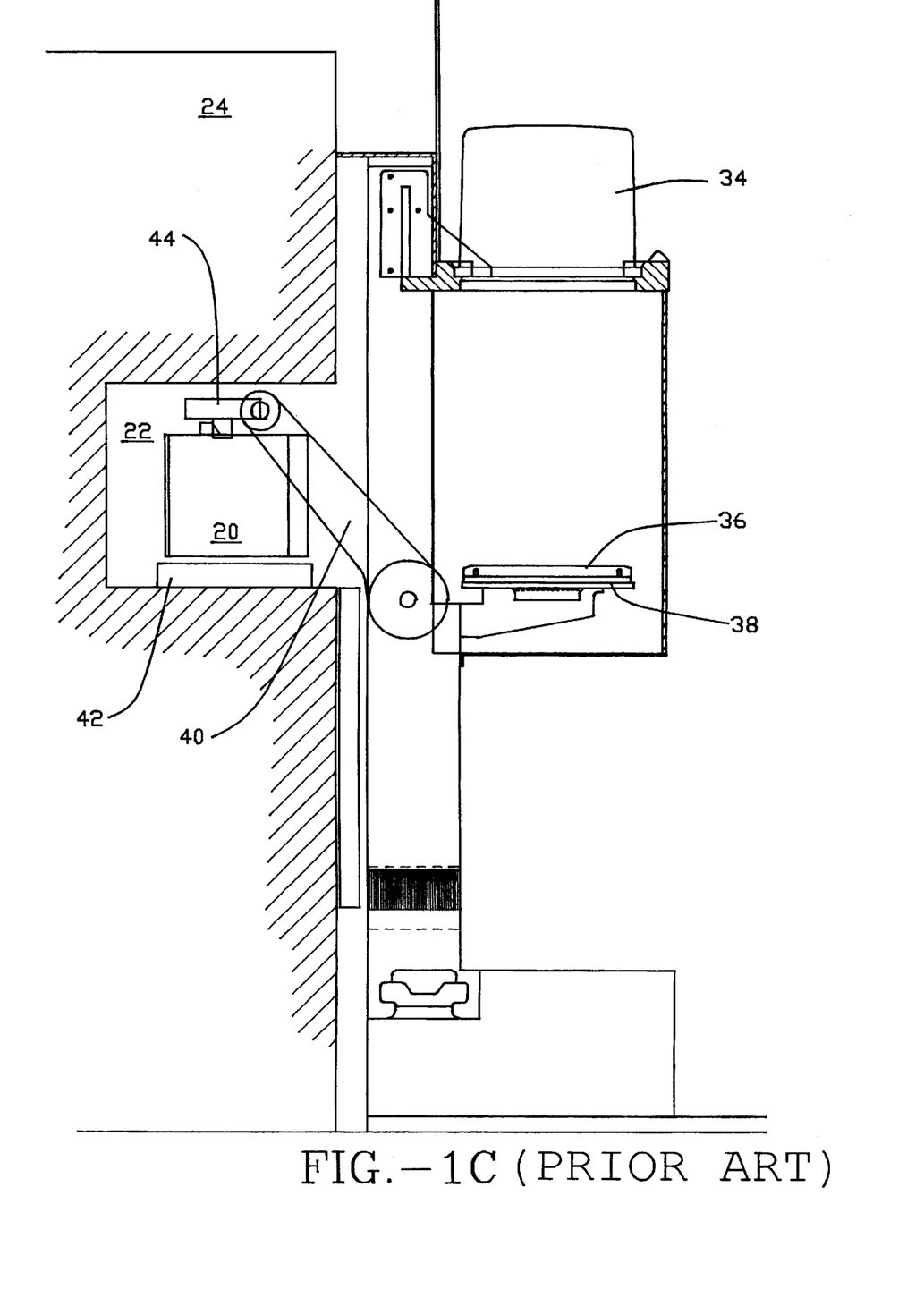
FIG. 1C is a side view of a conventional wafer cassette transfer mechanism for loading a cassette into a cassette chamber of a wafer processing station.

A conventional transfer mechanism for locating a cassette within a processing station cassette chamber for the systems of both FIGS. 1A and 1B is shown in FIG. 1C. A SMIF pod, including a top 34 and a door 36 for supporting the wafer cassette 20, is positioned on an indexer 38. The indexer first decouples the pod top from the pod door, and then lowers the pod door with the cassette thereon adjacent to the cassette chamber 22 of the processing station 24. Thereafter, a pivotally mounted robotic transfer arm 40 transfers the cassette 20 from the pod door 36 on the indexer to a cassette platform 42 (FIG. 1C) within the chamber 22, or an extended platform 26 (FIG. 1B) outside of the chamber 22. A top gripping mechanism 44 is provided on the free end of the arm 40 for gripping a features conventionally provided on a top surface of the cassette 20.

For a processing station such as that shown in FIGS. 1A and 1C, a transfer mechanism such as described above capable of transporting a cassette in both the X and Y directions is necessary in order to load a cassette into the cassette chamber. However, where movement of the cassette is required only in the Y direction, such as where a processing station includes an extendable platform as shown in FIG. 1B, a more simple and space efficient design may be accomplished.

SUMMARY OF THE INVENTION

It is therefore an object of the present invention to provide a simple and space efficient automated system for transferring a semiconductor wafer cassette from a SMIF pod onto a platform of a wafer processing station.

It is a further object of the present invention to provide a simple and space efficient automated system for transferring a semiconductor wafer cassette along a vertical axis.

It is another object of the present invention to provide an automated system for transferring a semiconductor wafer cassette by gripping the cassette from the sides of the cassette.

These and other objects are accomplished by the present invention which relates to a method and apparatus for removing a semiconductor wafer cassette from a SMIF pod and for transferring the cassette along a vertical axis to a platform of a wafer processing station. During transport and storage of a wafer cassette, the cassette is supported within a pod which is comprised of a pod door on which the cassette rests, and a pod top which mates with the pod door to provide a sealed environment within the pod. According to the present invention, a SMIF pod carrying a cassette is loaded onto a transfer device lying on a common vertical axis with the platform when the platform is extended. The pod is loaded on the transfer device such that the pod door lies in contact with a port door of the transfer device, and the pod top lies in contact with a port plate surrounding the port door.

The pod top is thereafter secured to the port plate by a pair of latches, and the pod door is decoupled from the pod top by a decoupling mechanism in the port door. Once decoupled, the port plate is moved upward relative to the port door so that the pod top supported on the port plate is separated from the pod door and cassette, which remain stationary with respect to the pod door.

At some point during the upward movement of the port plate, a pair of gripping arms pivotally mounted within the port plate reside in substantially the same horizontal plane as a pair of extensions, or ears, formed on opposite sides of the cassette. At this point, relative movement between the port plate and cassette is halted, and the gripping arms are pivoted inward to engage the ears of the cassette. Upon such engagement, upward movement of the port plate is resumed so that the cassette is transported upward with the port plate along a vertical axis.

The cassette is raised to an elevation sufficient to allow the platform retracted within the processing station cassette chamber to extend out of the chamber and under the cassette. Thereafter, the vertical motion of the port plate is reversed and the cassette is lowered along a vertical axis onto the platform, whereupon the gripping arms retract back into their recessed position within the port plate. Once located on the platform, the platform may be retracted to bring the cassette into the processing station cassette chamber, whereupon the wafer process to be performed within the station may be initiated.

BRIEF DESCRIPTION OF THE DRAWINGS

The invention will now be described with reference to the accompanying drawings in which.

DETAILED DESCRIPTION

The invention will now be described with reference to FIGS. 2A through 9, which in general relate to a transfer device for transferring a wafer cassette including one or more semiconductor wafers from a SMIF pod along a vertical axis to an extendable semiconductor processing station platform. While the present invention is described with respect to a SMIF system, it is understood that the present invention may be used with any of various pods for storing and transferring semiconductor wafers. As explained below, it is additionally contemplated that the present invention operate without a pod, so that a wafer cassette is loaded directly onto the transfer mechanism. The term "semiconductor wafer" or "wafer" as used herein refers to a wafer substrate as it may exist in any of the various stages of the semiconductor wafer fabrication process.

Figure 2A:
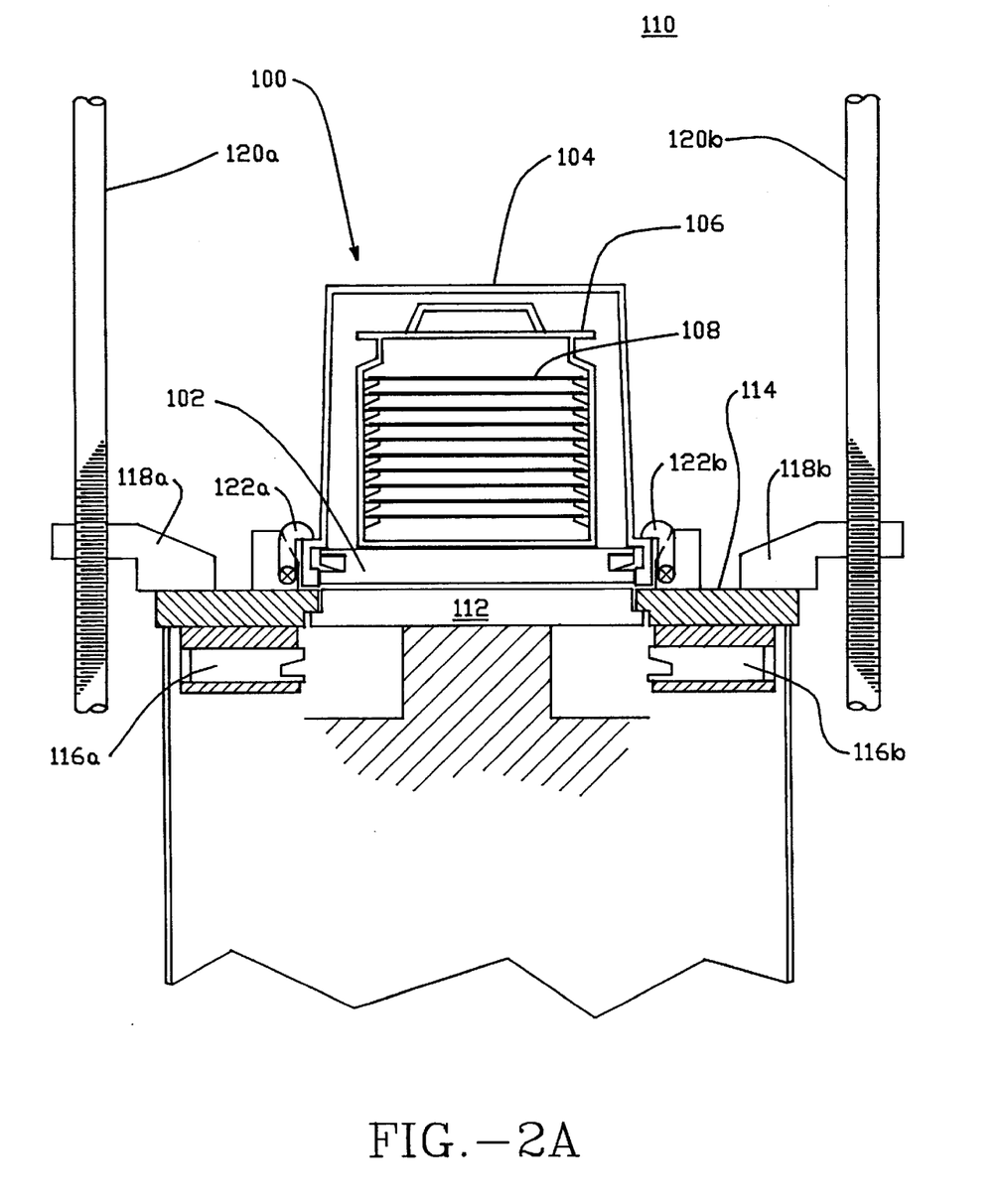
FIG. 2A is a front view of a wafer cassette within a SMIF pod as it is initially loaded onto a cassette transfer mechanism according to the present invention.

Referring now to FIG. 2A, there is shown a SMIF pod 100 comprised of a pod door 102 and a pod top 104. The pod door mates with the pod top to define a sealed environment in which a wafer cassette 106 carrying one or more wafers 108 may be stored and transported. Although the present invention will be described herein with respect to transferring wafer cassettes sized to hold 200 mm wafers, it is understood that the present invention may be configured to transfer wafer cassettes sized to accept other size wafers, such as for example 150 mm and 300 mm wafers.

In order to transfer the cassette 106 from within the SMIF pod 100 to within a processing station, the SMIF pod 100 is located on a transfer device 110 according to the present invention which includes a port door 112, a port plate 114 surrounding the port door 112, a pair of gripping arms 116a and 116b within the port plate, support members 118a and 118b for engaging lead screws 120a and 120b, and a pair of pod top restraint latches 122a and 122b. A central processing unit ("CPU") (not shown) is provided for controlling the operation of, and for monitoring feedback signals from, various components of the transfer device 110 as explained hereinafter.

Figure 2B:
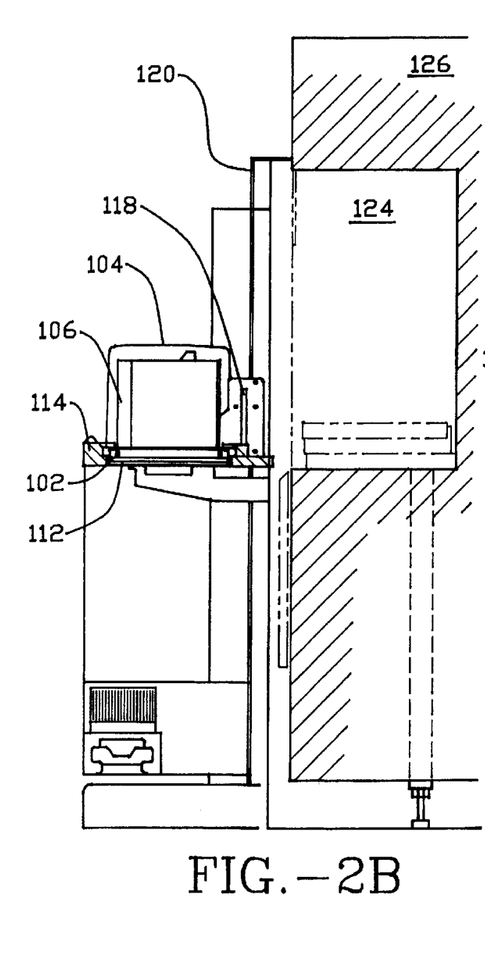
FIG. 2B is a side view of a wafer cassette within a SMIF pod as it is initially loaded onto a cassette transfer mechanism according to the present invention mounted proximate to a cassette chamber of a wafer processing station.

Referring now to FIGS. 2A and 2B, in preparation for transferring the cassette 106 into a cassette chamber 124 of a wafer processing station 126, the pod 100 is manually or automatedly seated on top of the transfer device 110. The top surface of the transfer device may include a plurality of angled guide blocks (not shown) to allow easy guidance of the pod into proper position on top of the loadlock chamber.

When properly located on top of the transfer device 110, the pod door 102 lies in contact with the port door 112, and the outer rim of pod top 104 lies in contact with the port plate 110. Pod top restraint latches 122a and 122b are provided to secure the pod top 104 to the port plate 114. Once the pod 100 is properly positioned on the transfer device, the latches 122a and 122b are pivoted from a first, retracted position (not shown) to a second position shown in FIG. 2A. In the second position, the latches 122a and 122b positively secure the pod top to the port plate. The movement of the latches 122a and 122b between the first and second positions may be accomplished by a conventional solenoid or motor, the operation of which solenoid or motor is controlled by the CPU.

After the latches 122a and 122b have secured the pod top 104 to the port plate 114, the pod top 104 is decoupled from the pod door 102. This may be accomplished by a decoupling mechanism provided in the port door 112. Details relating to a decoupling mechanism 122 for use with the present invention are described in U.S. Pat. No. 4,995,430, entitled "Sealable Transportable Container Having Improved Latch Mechanism", which application is assigned to the owner of the present application and is incorporated by reference in its entirety herein. As would be appreciated by those skilled in the art, the decoupling mechanism may be comprised of structures other than that disclosed in the above-identified patent. It is further understood that, in alternative embodiments, the decoupling mechanism may decouple the pod top from the pod door before or during pivoting of the latches 122a and 122b to the restraining position.

Figure 3A:
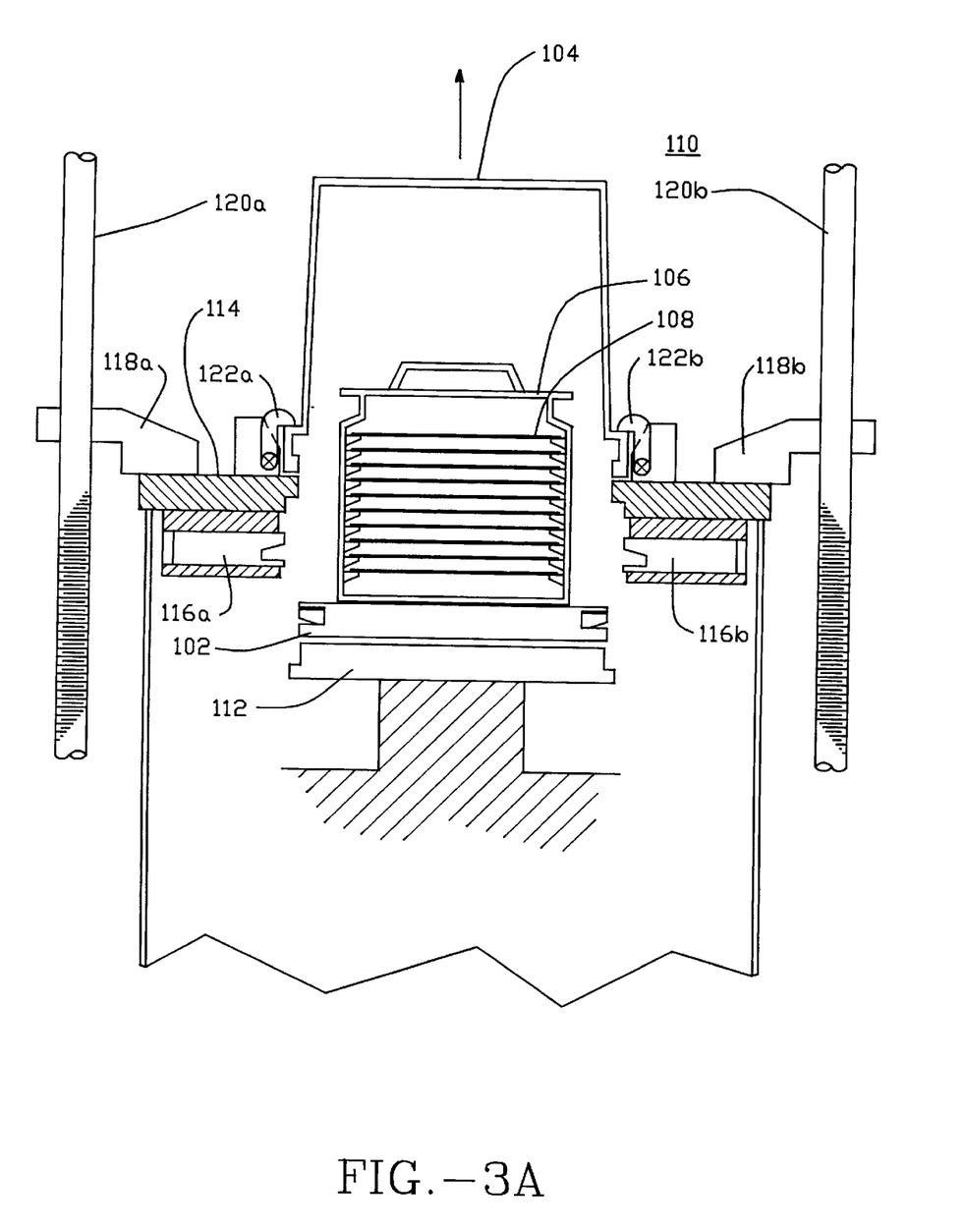
FIGS. 3A and 3B are front views of a wafer cassette being separated from a SMIF pod by the transfer mechanism according to the present invention.
Figure 3B:
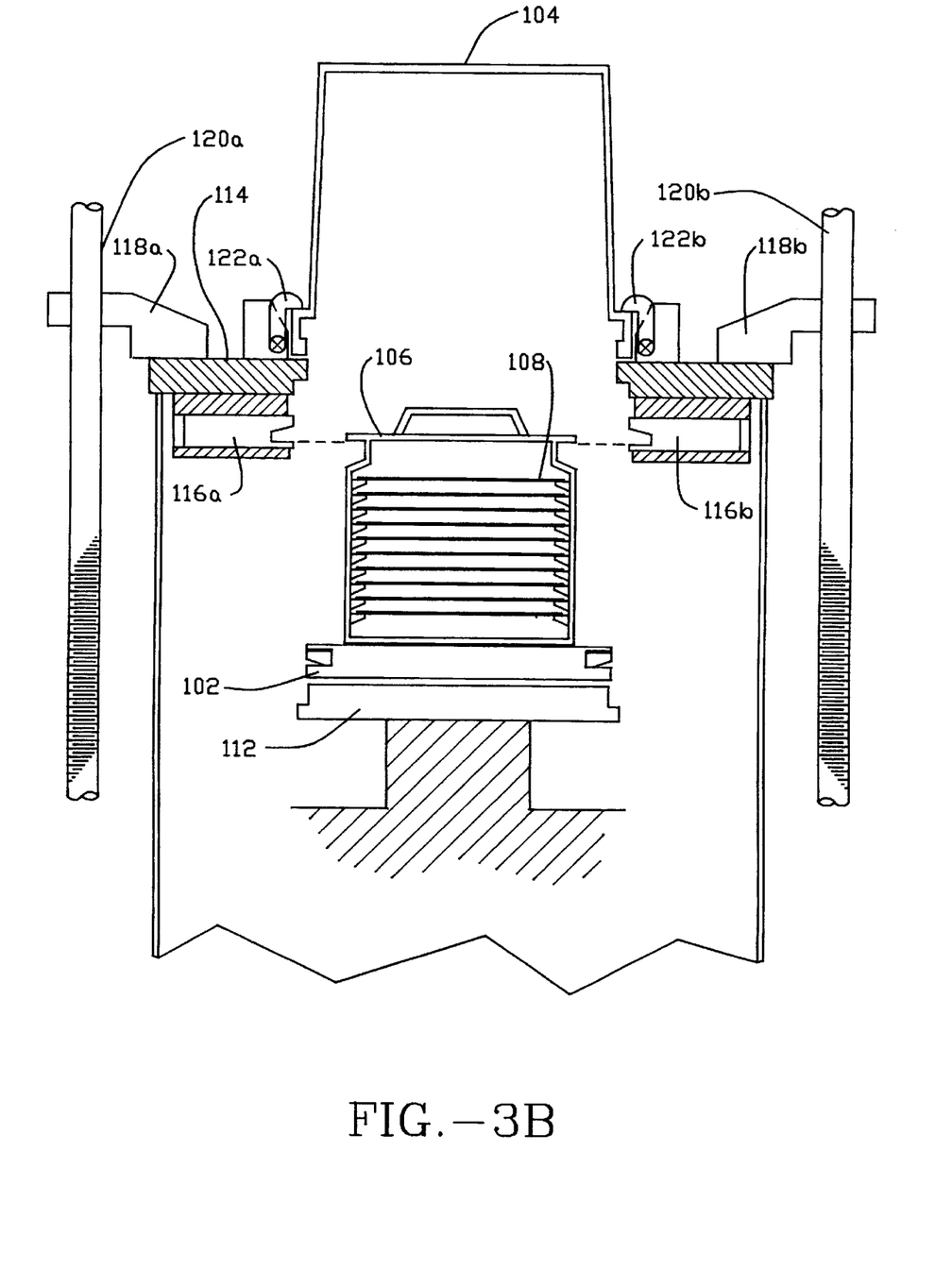
Figure 3C:
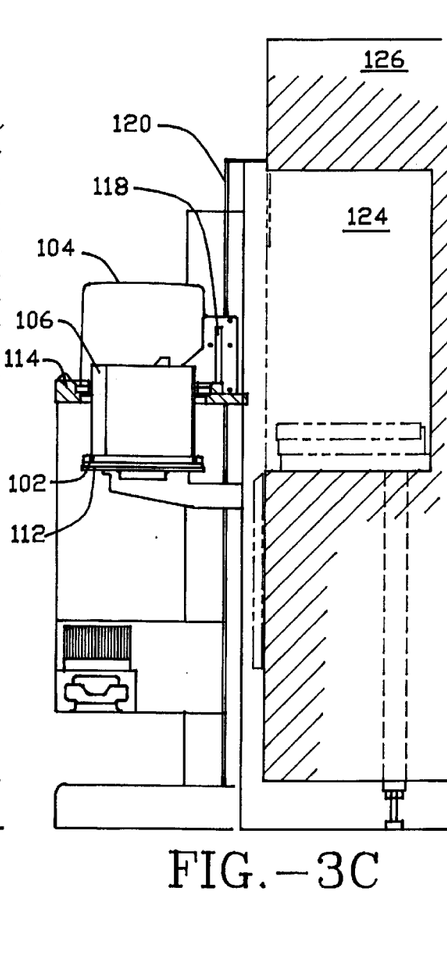
FIG. 3C is a side view of a wafer cassette being separated from a SMIF pod by the transfer mechanism according to the present invention mounted proximate to a cassette chamber of a wafer processing station.

Referring now to FIGS. 3A–3C, after the pod top 104 has been decoupled from the pod door 102, the port plate is moved in an upward direction by means of support members 118a, 118b and lead screws 120a, 120b (FIGS. 3A and 3B). Support members 118a, 118b include a threaded opening through which the lead screws 120a, 120b are provided such that rotation of lead screws 120a, 120b together in one direction will raise the port plate 114, and rotation of the lead screws 120a, 120b together in the opposite direction will lower the port plate. The pod top 104, supported on the port plate 114, moves upward with the port plate. The pod door 102 and the cassette 106, supported on the port door 112, remain stationary. As would be appreciated by those skilled in the art, structures other than support members 118a, 118b and lead screws 120a and 120b may be used to raise and lower the port plate 114. For example, FIG. 3C shows a single support member 118 to which the port plate is mounted, which support member 118 is engaged with a single lead screw 120 located proximate to the port plate 114. The rotation of the lead screw(s) may be accomplished by a conventional driver such as a stepper or multi-pole motor, the operation of which is controlled by the CPU.

Referring now to FIGS. 4A–5B, at some point during the upward movement of the port plate 114, the gripping arms 116a, 116b will reside in substantially the same horizontal plane as ears 130 on the cassette 106. The ears 130 are conventionally formed on a 200 mm wafer cassette, extending outward from opposite sides of the cassette 106. Once the gripping arms 116a, 116b are horizontally aligned with the ears 130, upward motion of the port plate 114 is halted and the gripping arms 116a, 116b are pivoted inward toward ears 130 from their retracted position within recesses 131a and 131b (FIG. 5A). The CPU may control the upward movement of the port plate 114 so as to stop the port plate after it achieves an elevation which has been predetermined to align the gripping arms 116a, 116b with the ears 130. Alternatively or additionally, the port plate 114 may include sensors (not shown) for sensing the relative position of the gripping arms to the cassette. The sensors send a signal to the CPU to stop motion and to actuate the gripping arms when the sensors detect the proper orientation of the gripping arms 116a, 116b to the ears 130.

Figure 4A:
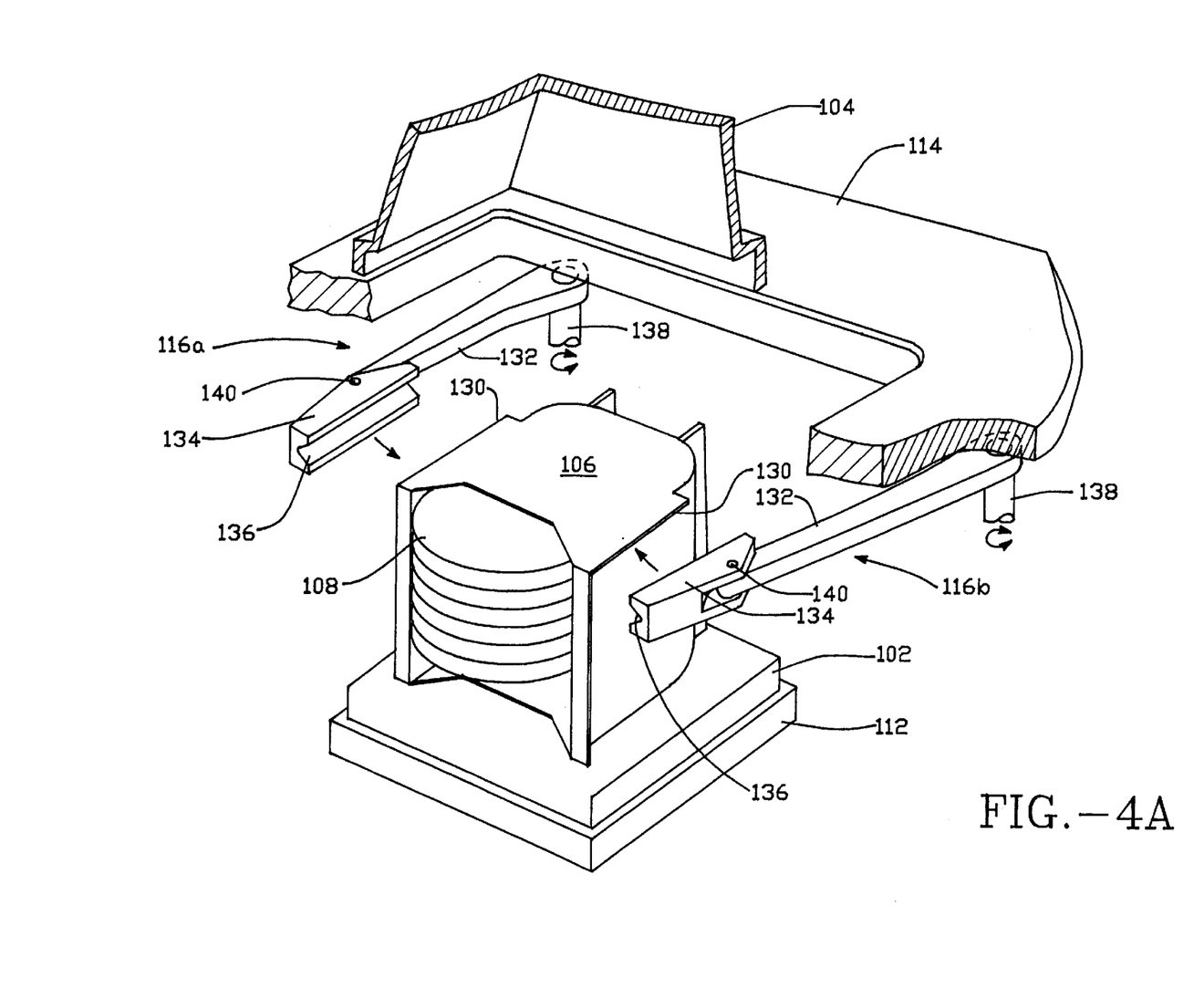
FIG. 4A is a perspective view of the transfer mechanism according to the present invention including gripping arms for gripping a wafer cassette.
Figure 4B:
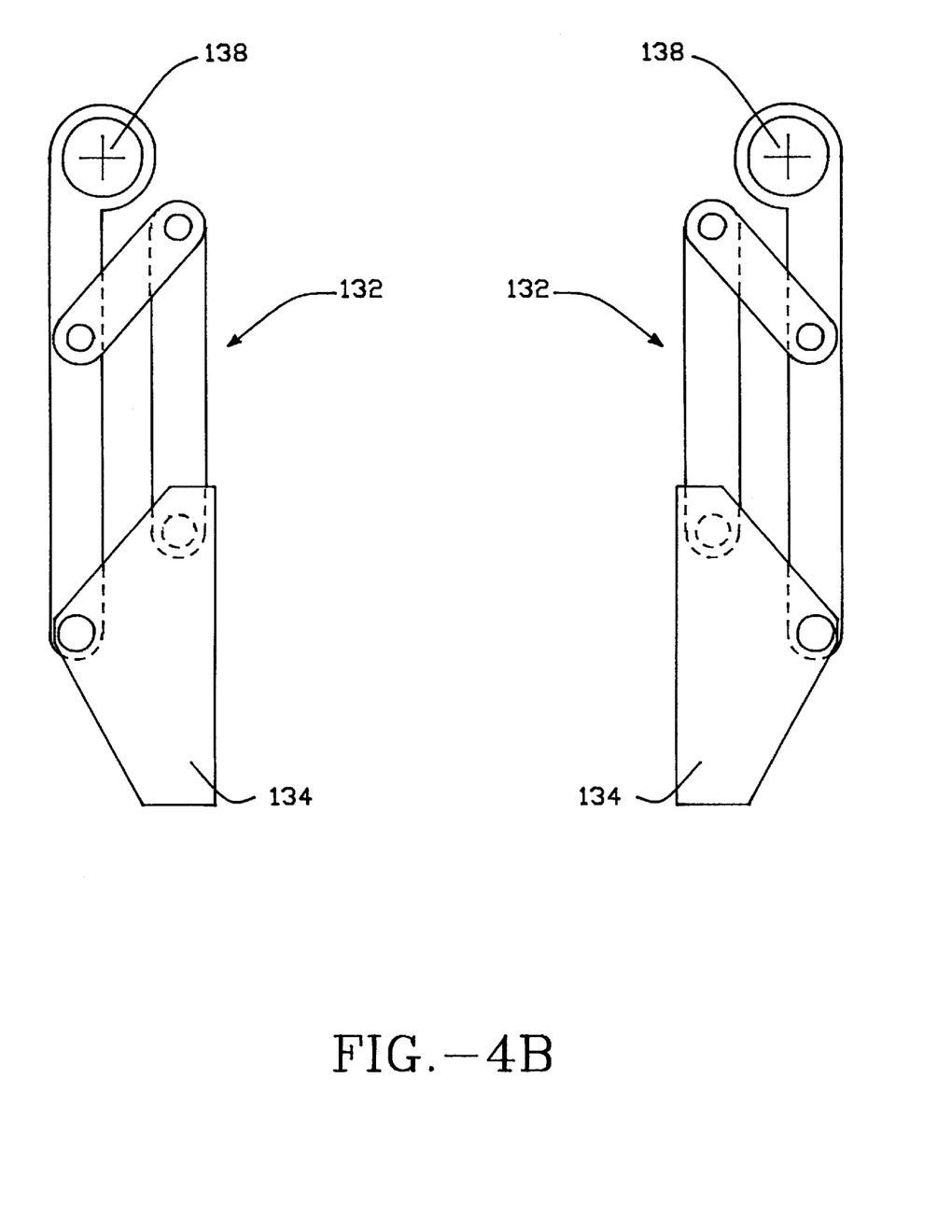
FIG. 4B is a top view of the gripping arms according to the present invention.

Gripping arms 116a, 116b each include a longitudinal member 132 having a first end rotationally mounted to the port plate 114, and a gripping pad 134 pivotally mounted on the free end of each longitudinal member 132. Each gripping pad 134 may include a slot 136 in which are received the ears 130 when the gripping arms are pivoted into engagement with the cassette 106. The longitudinal members and the gripping pads are preferably formed of rigid, durable, inert and stable materials such as for example aluminum, stainless steel or any of several high-strength polymers including polyetheretherkeytone ("PEEK") or teflon®. The longitudinal members 132 may be formed of the same or different material as the gripping pads 134.

Figure 5A:
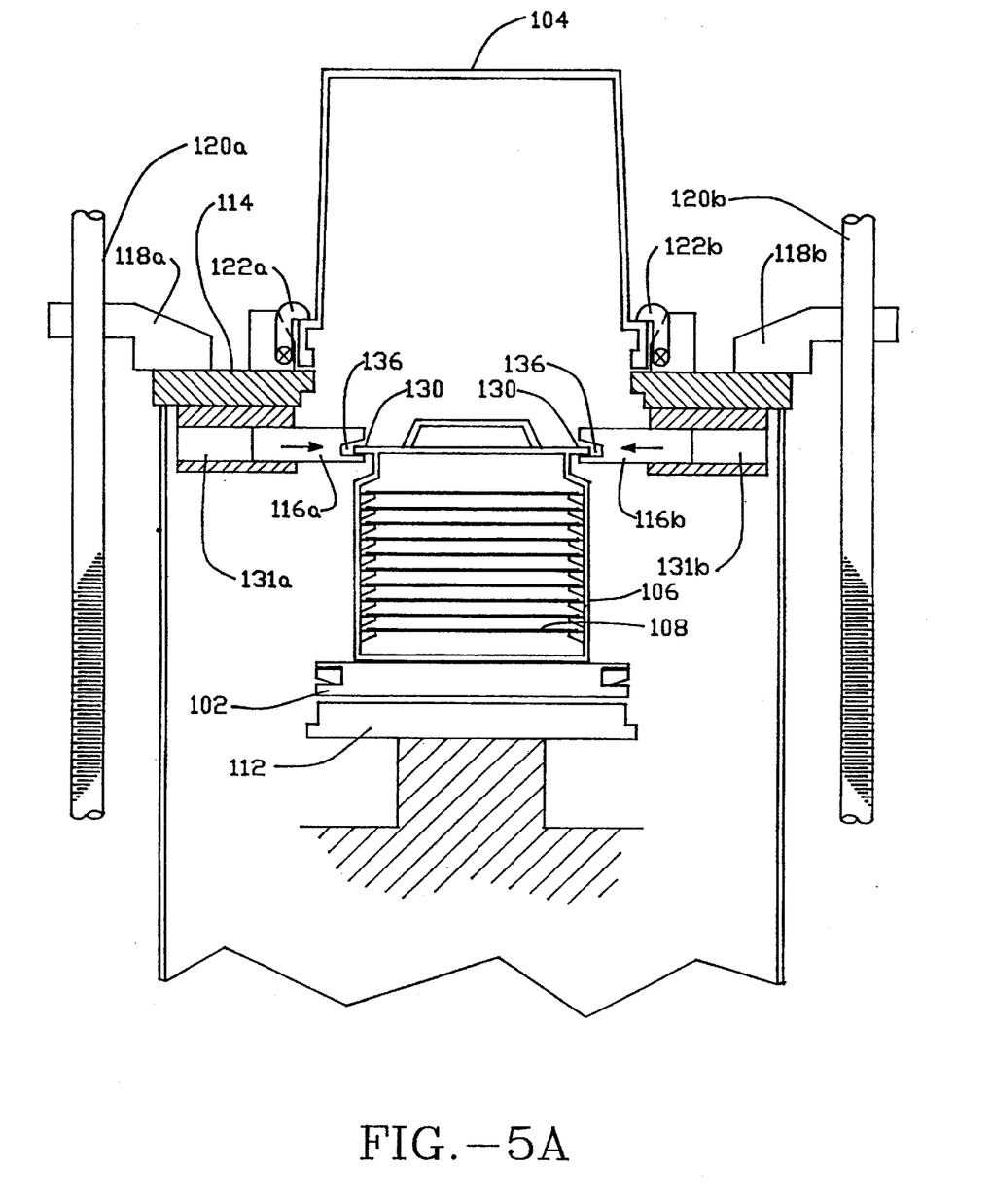
FIG. 5A is a front view of a wafer cassette being gripped by the transfer mechanism gripping arms according to the present invention.
Figure 5B:
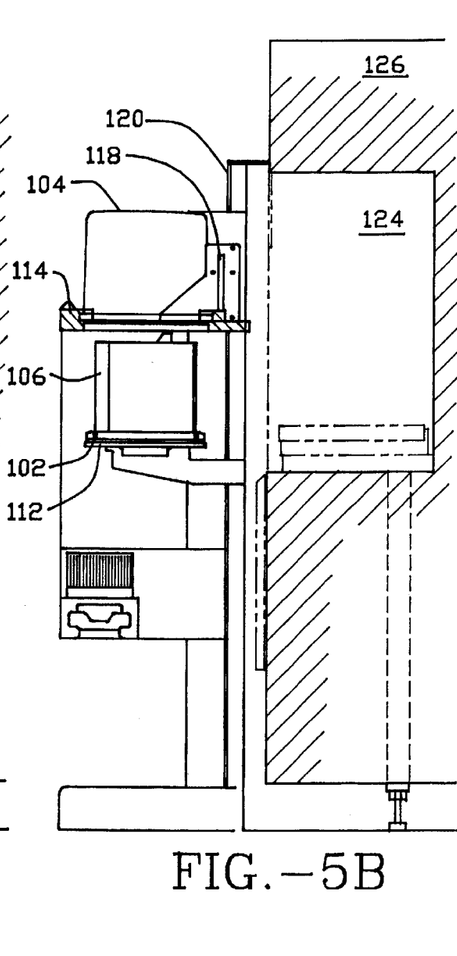
FIG. 5B is a side view of a wafer cassette being gripped by the transfer mechanism gripping arms according to the present invention mounted proximate to a cassette chamber of a wafer processing station.

The longitudinal members 132 may pivot with respect to the port plate 114 by being mounted on shafts 138 rotationally mounted on bearings (not shown) within the port plate 114. As shown in FIG. 4A, the gripping arms 116a, 116b are preferably mounted so as to rotate about a vertical axis. However, it is understood that the gripping arms may rotate about other axes. For example, the longitudinal members of the gripping arms may be mounted on shafts having axes that are parallel to the port plate 114 so that the gripping arms pivot about a horizontal axis. In such an embodiment, the gripping pads 134 would be provided at an angle with respect to the longitudinal members 132 so as to ensure that the slots 136 properly mate with the ears 130. It is further understood that the shafts 138 may be stationarily mounted within the port plate 114, and the longitudinal members rotationally mounted on the shafts. A conventional drive system, such as a solenoid, stepper or multi-pole motor, or pneumatic mechanism, may cooperate with a conventional driven system, such as a worm gear, to pivot the gripping arms 116a, 116b into their position of engagement with the cassette, and back again to their retracted position within recesses 131a, 131b (FIG. 5A). The operation of the drive system may be controlled by the CPU.

The gripping pads 134 may be pivotally mounted to the longitudinal members 132 by pins 140, which pins allow gripping pads 134 to pivot slightly with respect to the longitudinal member. Alternatively, as seen in FIG. 4B, the longitudinal members may each be comprised of four bar linkages such that the slots 136 of the gripping pads 134 are controlled to remain parallel to the ears 130 as the gripping arms pivot toward engagement with the cassette.

Gripping arm sensors (not shown) are preferably provided on either the gripping arms 116a, 116b or on the port plate 114 for sensing when the gripping arms 116a, 116b are in a home position, i.e., fully retracted within recesses 131a and 131b, respectively, and when the gripping arms are in an engaging position with the cassette. The gripping arm sensors may additionally sense when the gripping arms have pivoted past a position where cassette engagement is anticipated, to thereafter stop further inward rotation of the gripping arms. Thus, for example where no cassette is present, the gripping arms will rotate inward and stop when the absence of the cassette is detected.

Figure 6A:
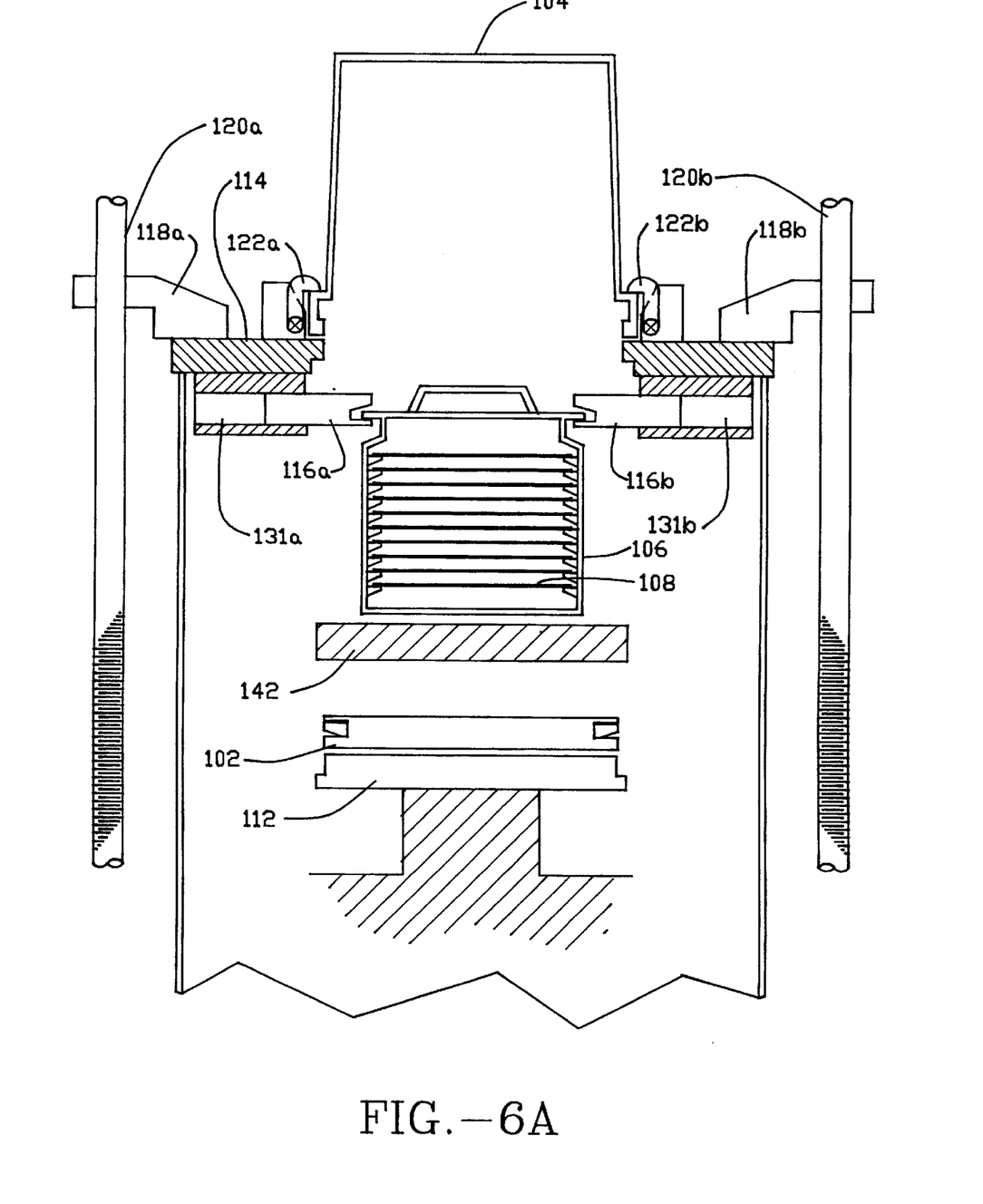
FIG. 6A is a front view of a wafer cassette being gripped by the transfer mechanism gripping arms according to the present invention with a processing station platform positioned under the cassette.
Figure 6B:
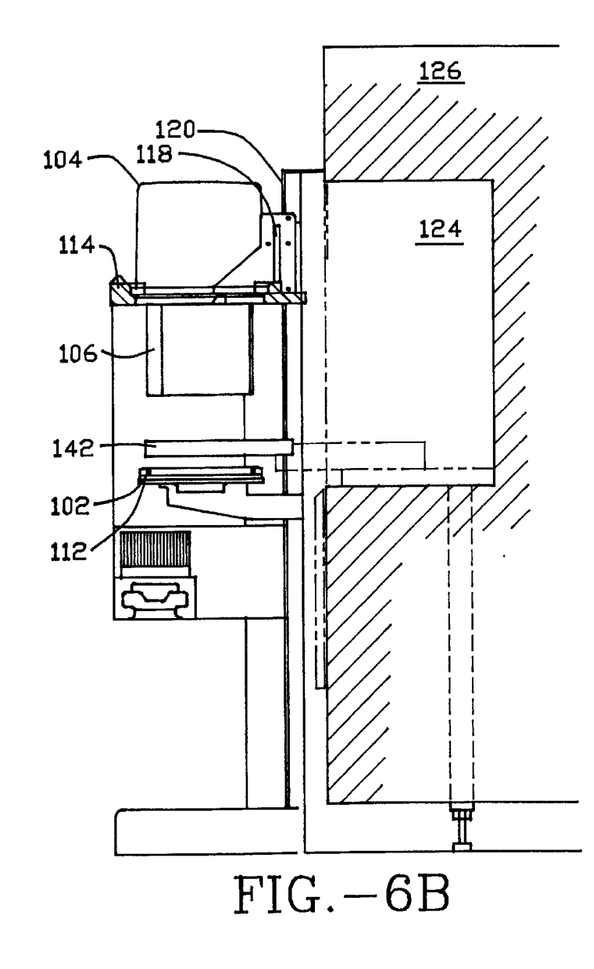
FIG. 6B is a side view of a wafer cassette being gripped by the transfer mechanism gripping arms according to the present invention with a processing station platform positioned under the cassette.

As shown in FIGS. 6A and 6B, after the cassette is gripped by the gripping arms 116a, 116b, the port plate resumes its upward motion at least enough so that a platform 142, previously retracted within the cassette chamber 124, may be extended from the chamber to a position under the cassette 106. Operation of the platform may be controlled by the CPU so that the platform 142 is extended once the port plate 114 reaches a predetermined elevation. Alternatively or additionally, sensors (not shown) may be provided on the port plate and/or processing station to indicate when the cassette has been sufficiently elevated to allow the platform to extend.

Figure 7:
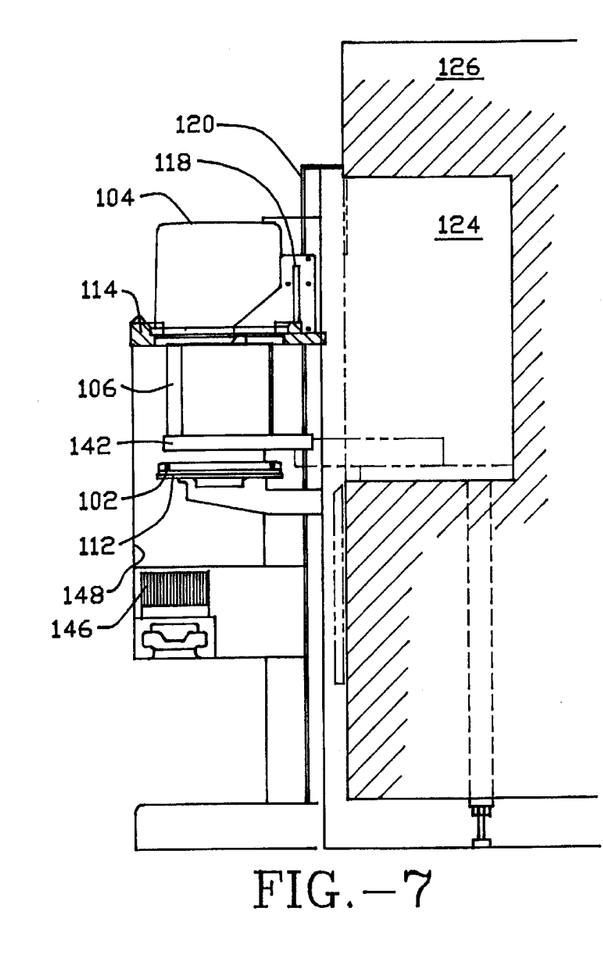
FIG. 7 is a side view of a wafer cassette located on top of a processing station platform.

Once the platform 142 has extended, the direction of rotation of the lead screw(s) may be reversed, to thereby lower the cassette 106 onto the platform 142 as shown in FIG. 7. Once the cassette 106 is positioned on the platform 142, the gripping arms 116a, 116b may disengage the ears 130 and return to their retracted position within recesses 131a, 131b, respectively, within the port plate. The CPU may control the downward movement of the port plate 114 to stop after the cassette has been lowered to an elevation which has been predetermined to locate the cassette on top of the platform. As stated above, the port plate 114 and/or processing station 126 may alternatively or additionally include sensors (not shown) for sensing the relative position of the cassette to the platform. The sensors send a signal to the CPU to stop the downward motion of the port plate when the sensors detect that the cassette is seated on the platform.

While the preferred embodiment of the present invention includes the above-described gripping arms for gripping the ears formed on the wafer cassette, it is understood that other gripping systems may be used to grip a cassette from the sides of the cassette, move the cassette along a Y-axis until the cassette is at an elevation that allows a platform to be located thereunder, and then to lower the cassette along the Y-axis onto the platform. For example, as described in U.S. patent application Ser. No. 08/394,698 entitled, "STANDARD MECHANICAL INTERFACE VACUUM LOAD-LOCK CHAMBER", previously incorporated by reference, the present invention may include a pair of pawls mounted in the port plate for gripping a cassette by engaging slots formed in the sides of the cassette as the port plate moves upward. A cassette including such slots is described in U.S. patent application Ser. No. 08/311,954 entitled, "SEMICONDUCTOR WAFER CASSETTE", previously incorporated by reference.

Figure 8:
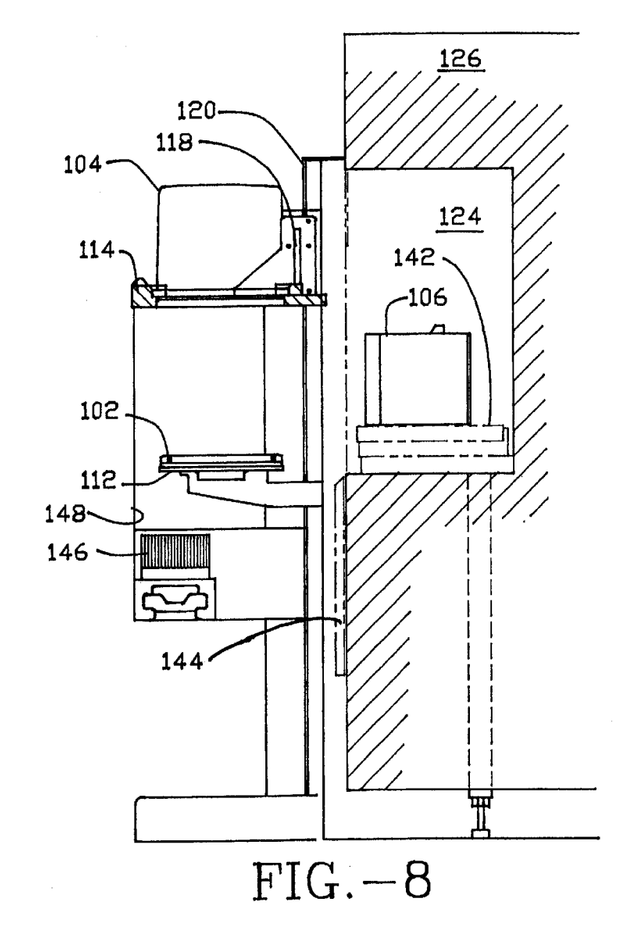
FIG. 8 is a side view of a wafer cassette located on top of a processing station platform within a cassette chamber of the processing station.
Figure 9:
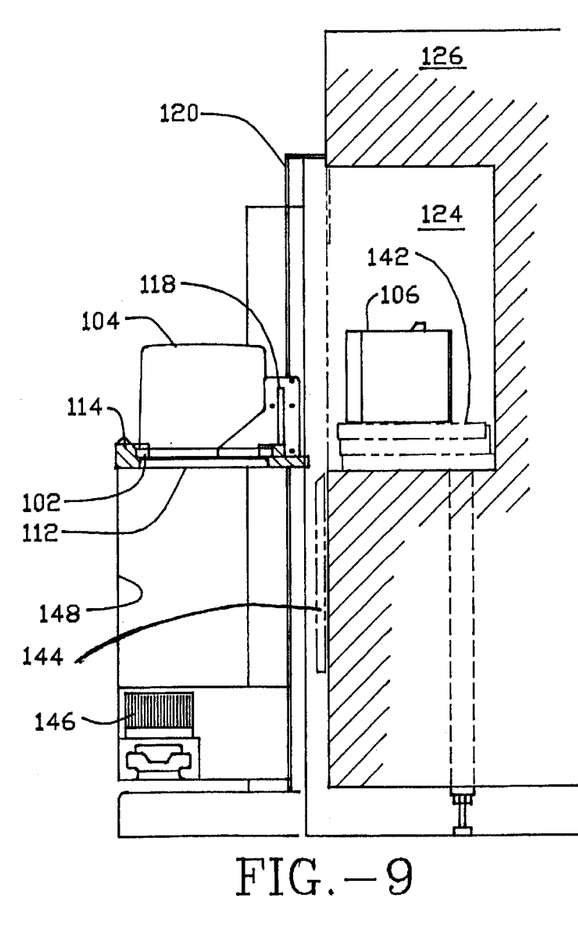
FIG. 9 is a side view of a sealed SMIF pod after a wafer cassette has been located within a cassette chamber of a wafer processing station.

As shown in FIG. 8, after the platform 142 retracts into the cassette chamber 124, the port plate 114 may move downward to reunite the pod door 102 with the pod top 104. Also, a door 144 on the processing station 126 (shown in an open position) may seal the cassette chamber so that the wafer process to be performed within the station 126 may be initiated.

Although not critical to the present invention, a fluid circulation system 146 (FIGS. 7–9) may additionally be provided within a chamber defined by pod top 104, port plate 114, and the walls 148 of the transfer mechanism 110. The fluid circulation system injects clean air into the chamber, which clean air flows out of openings in the chamber to the atmosphere surrounding the chamber. The positive flow of clean air out of the chamber openings prevents contaminants from the surrounding atmosphere from entering into the chamber through the openings.

Up to this point, the port door 112 and pod door 102 have been described as remaining stationary while the port plate 114 and pod top 104 have been raised. However in an alternative embodiment of the invention, the port door 112 may also be connected to an elevator mechanism so as to move downward after the pod door has been separated from the pod top. In this embodiment, the port door moves downward until the ears 130 on the cassette 106 lie in substantially the same horizontal plane as the gripping arms 116a and 116b. At that point, the gripping arms 116a, 116b engage the cassette 106 as described above. Even in an embodiment where the port door lowers, the port plate must still be capable of vertical movement so as to ensure that the cassette is high enough to allow the platform 142 to extend, and then to lower the cassette 106 onto the platform. In a further embodiment, the port plate may be moved upward at the same time as the port door is moved downward so as to achieve the desired alignment of the gripping arms 116a, 116b with the ears 130 on the cassette.

In a still further embodiment of the invention, the cassette may be utilized without the SMIF pod 100. In this embodiment, the cassette 106 may be located directly on top of the port door 112, and then the port plate 114 may be moved relative to the port door 112 until the gripping arms 116a, 116b lie in substantially the same horizontal plane as the ears 130. Thereafter, the gripping arms grip and transfer the cassette 106 as described above.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. An apparatus for removing a wafer cassette from a SMIF pod and for transferring the wafer cassette along a vertical axis to a platform of a wafer processing station, said platform moving substantially horizontally between a first position within a wafer processing station and a second position where the platform intersects the vertical axis, the SMIF pod including a pod top and a pod door, the pod door supporting the wafer cassette, the apparatus comprising:

a port plate provided for receiving and supporting the SMIF pod top, and for moving along the vertical axis;

a port door for receiving and supporting the wafer cassette;

gripping arms mounted within said port plate for gripping sides of the wafer cassette;

means for pivoting said gripping arms between a first position where said gripping arms are not engaged with the wafer cassette and a second position where said gripping arms are engaged with the wafer cassette; and means for: 1) raising the cassette gripped by said gripping arms within said port plate along the vertical axis to a height where a bottom of the cassette resides in a first horizontal plane that is above a second horizontal plane in which a top of the platform resides, and 2) lowering the cassette gripped by said gripping arms within said port plate along the vertical axis when the platform is in said second position to a height where the cassette is supported on the platform.

2. An apparatus for transferring a wafer cassette along a vertical axis between a SMIF pod and a platform of a wafer processing station, said platform moving substantially horizontally between a first position within a wafer processing station and a second position where the platform is extended from the wafer processing station, the SMIF pod including a pod top capable of mating with a pod door, the pod door supporting the wafer cassette, the apparatus comprising:

a port plate including an opening, said port plate capable of being affixed adjacent the wafer processing station, and said port plate capable of supporting the pod top;

means for translating said port plate along the vertical axis;

a port door mounted within said opening capable of supporting said pod door; and gripping means, capable of moving along the vertical axis with said port plate, for gripping the wafer cassette.

3. The apparatus for transferring a wafer cassette between a SMIF pod and a platform of a wafer processing station along a vertical axis as recited in claim 2, said gripping means further capable of lifting the wafer cassette off of the pod door a distance sufficient to allow the platform to extend from the first position to the second position under the wafer cassette.

4. The apparatus for transferring a wafer cassette between a SMIF pod and a platform of a wafer processing station along a vertical axis as recited in claim 2 wherein said means for translating said port plate comprises at least one lead screw, said port plate being attached to said at least one lead screw.

5. The apparatus for transferring a wafer cassette between a SMIF pod and a platform of a wafer processing station along a vertical axis as recited in claim 2 further including means for sensing a vertical height of said port plate.

6. The apparatus for transferring a wafer cassette between a SMIF pod and a platform of a wafer processing station along a vertical axis as recited in claim 2, wherein said gripping means comprise a pair of gripping arms pivotally mounted to said port plate, said gripping arms capable of gripping and supporting the wafer cassette.

7. The apparatus for transferring a wafer cassette between a SMIF pod and a platform of a wafer processing station along a vertical axis as recited in claim 2, further comprising means for sensing a position of said gripping means.

8. The apparatus for transferring a wafer cassette between a SMIF pod and a platform of a wafer processing station along a vertical axis as recited in claim 2, further comprising means for lowering said port door.

9. The apparatus for transferring a wafer cassette between a SMIF pod and a platform of a wafer processing station along a vertical axis as recited in claim 8, wherein said means for lowering said port door comprises an elevator beneath said port plate.

* * * * *